United States Patent
Ando

(10) Patent No.: US 7,436,075 B2
(45) Date of Patent: Oct. 14, 2008

(54) ION BEAM IRRADIATION APPARATUS AND ION BEAM IRRADIATION METHOD

(75) Inventor: Yasunori Ando, Kyoto (JP)

(73) Assignee: Nissin Ion Equipment Co., Ltd., Kyoto (JP)

(*) Notice: Subject to any disclaimer, the term of this patent is extended or adjusted under 35 U.S.C. 154(b) by 95 days.

(21) Appl. No.: 10/590,911

(22) PCT Filed: Aug. 31, 2005

(86) PCT No.: PCT/JP2005/015919

§ 371 (c)(1),
(2), (4) Date: Aug. 28, 2006

(87) PCT Pub. No.: WO2006/025452

PCT Pub. Date: Mar. 9, 2006

(65) Prior Publication Data

US 2007/0184596 A1  Aug. 9, 2007

(30) Foreign Application Priority Data

Sep. 2, 2004  (JP)  ............................. 2004-255648

(51) Int. Cl.
*H01L 21/00* (2006.01)
*H01L 21/44* (2006.01)

(52) U.S. Cl. .................... 257/787; 257/788; 257/798; 257/E21.203; 257/E21.569; 257/E21.572; 438/14; 438/16; 438/718

(58) Field of Classification Search ............... 257/767, 257/787, 788, E21.203, E21.569, E21.572, 257/E21.709; 438/14, 16, 18, 718
See application file for complete search history.

(56) References Cited

U.S. PATENT DOCUMENTS

| 4,278,493 | A | * | 7/1981 | Petvai | .................. 204/192.32 |
| 4,975,586 | A | * | 12/1990 | Ray | ........................ 250/492.2 |
| 5,474,797 | A | * | 12/1995 | Sioshansi et al. | ........... 427/2.24 |
| 6,172,372 | B1 | * | 1/2001 | Vanderpot | .............. 250/492.21 |
| 7,064,340 | B1 | * | 6/2006 | Vanderberg et al. | .... 250/492.21 |

FOREIGN PATENT DOCUMENTS

| JP | 02-278643 | 11/1990 |
| JP | 09-218408 | 8/1997 |
| JP | 10-162770 | 6/1998 |

(Continued)

*Primary Examiner*—Michael S Lebentritt
(74) *Attorney, Agent, or Firm*—Finnegan, Henderson, Farabow, Garrett & Dunner, L.L.P.

(57) ABSTRACT

The ion beam irradiation apparatus has a vacuum chamber 10, an ion source 2, a substrate driving mechanism 30, rotation shafts 14, arms 12, and a motor. The ion source 2 is disposed inside the vacuum chamber 10, and emits an ion beam 4 which is larger in width than a substrate 6, to the substrate 6. The substrate driving mechanism 30 reciprocally drives the substrate 6 in the vacuum chamber 10. The center axes 14a of the rotation shafts 14 are located in a place separated from the ion source 2 toward the substrate, and substantially parallel to the surface of the substrate. The arms 12 are disposed inside the vacuum chamber 10, and support the ion source 2 through the rotation shafts 14. The motor is disposed outside the vacuum chamber 10, and reciprocally rotates the rotation shaft 14.

5 Claims, 4 Drawing Sheets

FOREIGN PATENT DOCUMENTS

| | | |
|---|---|---|
| JP | 2000-012282 | 1/2000 |
| JP | 2000-122064 | 4/2000 |
| JP | 2001-101990 | 4/2001 |
| JP | 2002-062532 | 2/2002 |
| JP | 2005-174871 | 6/2005 |
| JP | 2005-189788 | 7/2005 |

\* cited by examiner

ION BEAM IRRADIATION APPARATUS AND ION BEAM IRRADIATION METHOD

TECHNICAL FIELD

The present invention relates to an ion beam irradiation apparatus and an ion beam irradiation method which irradiate a substrate to be processed with an ion beam, thereby processing the substrate. The apparatus and the method are used for, in production of a liquid crystal display or the like, applying an alignment process on an alignment film formed on the surface of a substrate for the liquid crystal display, or forming an alignment film on the surface of a substrate for the liquid crystal display and applying an alignment process on the alignment film.

BACKGROUND ART

JP-A-9-218408 (columns 0011 and 0012, and FIG. 1) (hereinafter, referred to as Patent Reference 1) discloses a technique in which an ion beam is caused to enter at a predetermined incident angle an alignment film formed on the surface of a substrate for a liquid crystal display, to apply an alignment process (i.e., a process of aligning liquid crystal molecules in a predetermined direction) on the alignment film.

Furthermore, JP-A-2002-62532 (columns 0018 and 0019, and FIGS. 2 and 4) (hereinafter, referred to as Patent Reference 2) discloses a technique in which the surface of a substrate is irradiated with an ion beam while reciprocating the substrate in parallel to the surface of the substrate with respect to an ion source placed at a predetermined angle to the substrate, thereby forming an alignment film for the liquid crystal display on the surface of the substrate and applying an alignment process on the alignment film.
Patent Reference 1: JP-A-9-218408
Patent Reference 2: JP-A-2002-62532

DISCLOSURE OF THE INVENTION

Problems that the Invention is to Solve

In ion beam irradiation such as an alignment process by an ion beam or the like, the conditions of irradiation of an ion beam are often changed in order to cope with many kinds. Also the incident angle of an ion beam to the substrate surface is one of the irradiation conditions.

In the case where an ion source is attached to the outside of a vacuum chamber via a flange as the technique disclosed in Patent Reference 1, it is not impossible, but is difficult to change the incident angle of an ion beam by changing the angle of the ion source, because, when the incident angle is to be changed, the structure of the flange portion must be changed, the changeable range of the angle is very narrow, and the vacuum chamber must be opened.

A specific structure for changing the incident angle of an ion beam is not described in Patent Reference 2.

There is an idea that the ion source is fixed to a support member disposed inside the vacuum chamber. Also in this case, when the incident angle is to be changed, the structure of the support member portion must be changed, and the vacuum chamber must be opened. Therefore, it is not easy to change the incident angle.

There is another idea that, as an example shown in FIG. 7, an ion source 2 having, on a side portion of the ion source 2, a rotation shaft 8 which reciprocally rotates the ion source 2 as indicated by the arrow A is disposed in a vacuum chamber. When the incident angle $\theta$ of an ion beam 4 emitted from the ion source 2 to a substrate 6 is to be changed, however, the vacuum chamber must be opened. Therefore, it is not easy to change the incident angle $\theta$ of the ion beam 4 to the substrate 6.

In the apparatus of FIG. 7, referring also to FIG. 8, the ion beam 4 which is wider than the width $W_2$ in the Y-direction of the rectangular substrate 6 is emitted from the ion source 2 to the substrate 6. The substrate 6 is reciprocally driven in the X-direction which is substantially perpendicular to the Y-direction.

In the case of the example of FIG. 7, furthermore, the rotation center of the ion source 2, i.e., the center axis $8a$ of the rotation shaft 8 is located inside the ion source 2. When the incident angle $\theta$ is to be changed by rotating the ion source 2, therefore, the irradiation position of the ion beam 4 to the substrate 6 largely differs depending on the incident angle $\theta$ as shown in FIG. 7. As a result, as the incident angle $\theta$ is made smaller, the irradiation position of the ion beam 4 to the substrate 6 becomes farther. Therefore, the size of the apparatus must be increased. As the example shown in FIG. 8, moreover, also the size of the irradiation region $S_1, S_2, \ldots$ of the ion beam 4 to the substrate 6 is largely varied depending on the incident angle $\theta$. Namely, as the incident angle $\theta$ is made smaller, the irradiation region is larger. As a result, in order to irradiate the whole face of the substrate 6 with the ion beam 4, the driving distance (scan width) in the X-direction of the substrate 6 must be longer as the irradiation region of the ion beam 4 is larger. Therefore, the size of the apparatus is increased, and the substrate process time is prolonged, so that the throughput of the apparatus is lowered.

It is a principal object of the invention to provide an ion beam irradiation apparatus in which the incident angle of an ion beam can be easily changed, and, even when the incident angle is to be made smaller, deviation of the irradiation position and spreading of the irradiation region can be suppressed to a small degree, and an ion beam irradiation method using it.

Means for Solving the Problems

The ion beam irradiation apparatus of the invention comprises: a vacuum chamber which is to be evacuated to a vacuum; an ion source which is disposed inside the vacuum chamber, and which irradiates a substrate to be processed with an ion beam that is larger in width than the substrate; a substrate driving mechanism which drives the substrate in the vacuum chamber in a direction that is substantially perpendicular to a width direction of the ion beam emitted from the ion source; a rotation shaft which is passed through the vacuum chamber, and a center axis of which is located in a place separated from the ion source toward the substrate, and substantially parallel to a surface of the substrate; an arm which is disposed inside the vacuum chamber, and which supports the ion source through the rotation shaft; and a motor which is disposed outside the vacuum chamber, and which reciprocally rotates the rotation shaft, the ion source being supported to be rotatable about the center axis of the rotation shaft.

According to the ion beam irradiation apparatus, the ion source is rotated from the outside of the vacuum chamber without opening the vacuum chamber, and about the center axis of the rotation shaft, by rotating the rotation shaft by the motor, whereby the incident angle of the ion beam to the substrate can be changed. Therefore, this change is easily conducted.

Furthermore, the center axis of the rotation shaft is located at a place separated from the ion source toward the substrate, and the ion source is rotated about the center axis. Even in the case of a small incident angle, therefore, deviation of the irradiation position of the ion beam to the substrate, and spreading of the irradiation region of the ion beam to the substrate can be suppressed to a small degree as compared with the case where the center axis is located inside the ion source.

A distance between the center axis of the rotation shaft and the surface of the substrate may be equal to or less about a half (the lower limit is 0) of a width of the ion source on a side of a rotation direction, or a width on a side of an outlet of the ion source.

The rotation shaft and the arm may be configured by a hollow magnetic member to have a magnetic shielding function, and set to a ground potential, and a conductor through which an electric power is supplied from an outside of the vacuum chamber to the ion source may be passed through in the rotation shaft and the arm.

A beam measuring instrument which measures a current density distribution in the width direction of the ion beam emitted from the ion source may be disposed at a position which is inside the vacuum chamber, and which is opposed to the ion source across a passage for the substrate, the ion source being located at a predetermined angle with respect to the substrate.

The beam measuring instrument may be disposed at a position opposed to the ion source which is located at an angle that is substantially perpendicular to the substrate.

The ion beam irradiation method of the invention is an ion beam irradiation method which uses the ion beam irradiation apparatus in which the beam measuring instrument is disposed, wherein the method comprises the steps: locating the ion source at an angle at which the ion source is opposed to the beam measuring instrument, and, with using the beam measuring instrument, measuring the current density distribution of the ion beam emitted from the ion source; then determining whether the measured current density distribution is within a predetermined allowable range or not, proceeding to a next step if within the allowable range, and, if not within the allowable range, adjusting the current density distribution to be within the allowable range; then locating the ion source at a predetermined angle required for processing the substrate; and then applying a process on the substrate by irradiating the substrate with the ion beam from the ion source while driving the substrate by the substrate driving mechanism.

According to the ion beam irradiation method, the angle of the ion source can be easily adjusted to a desired value from the outside of the vacuum chamber. As required such as for each substrate or for each lot of substrates, for example, the ion source is moved to a measurement position, the current density distribution of the ion beam is measured and evaluated, and necessary adjustment is conducted, and thereafter the ion source can be moved to a process position to apply the process on the substrate. As a result, the stable process can be conducted easily.

Effects of the Invention

According to the invention of claim 1, the ion source is rotated from the outside of the vacuum chamber without opening the vacuum chamber, and about the center axis of the rotation shaft, by rotating the rotation shaft by the motor, whereby the incident angle of the ion beam to the substrate can be easily changed.

Furthermore, the center axis of the rotation shaft is located at a place separated from the ion source toward the substrate, and the ion source is rotated about the center axis. Even in the case of a small incident angle, therefore, deviation of the irradiation position of the ion beam to the substrate, and spreading of the irradiation region of the ion beam to the substrate can be suppressed to a small degree. As a result, miniaturization of the apparatus is enabled, and lowering of the throughput of the apparatus can be suppressed.

Moreover, the adjustment of the incident angle can be electrically controlled by controlling the motor. Therefore, the substrate can be processed easily and efficiently at a desired incident angle.

According to the invention of claim 2, the following further effects are attained. Namely, the center axis of the rotation shaft is located at a place which is near the surface of the substrate as described above. Even in the case of a small incident angle, therefore, deviation of the irradiation position of the ion beam to the substrate, and spreading of the irradiation region of the ion beam to the substrate can be suppressed to a small degree. As a result, further miniaturization of the apparatus is enabled, and lowering of the current density distribution of the ion beam in the substrate surface when the incident angle is small can be suppressed to a smaller degree.

According to the invention of claim 3, the following further effects are attained. Namely, even when the conductor through which the electric power is supplied to the ion source must be laid near the ion source because of, for example, the ion source is housed in the vacuum chamber and the space inside the vacuum chamber is restricted, the conductor is passed through in the rotation shaft and the arm which have the magnetic shielding function, and hence leakage of a magnetic field generated by a current flowing through the conductor can be suppressed to prevent the magnetic field from adversely affecting the ion beam emitted from the ion source. For example, the current density distribution of the ion beam emitted from the ion source can be prevented from being disturbed.

The circumference of the ion source is a vacuum environment, and there are many ions and electrons which will function as a trigger for discharge. In the case where the conductor is not passed through in the rotation shaft and the arm but passed through the vacuum chamber while being exposed, when a high voltage is applied to the conductor, therefore, a phenomenon in which a discharge is generated with respect to a neighboring portion of a different potential, and the emission of an ion beam from the ion source becomes unstable easily occurs. In the invention, however, the conductor is passed through in the rotation shaft and the arm which are at the ground potential, and electrically shielded from the atmosphere in the vacuum chamber. Therefore, it is possible to suppress occurrence of the phenomenon in which, when a high voltage is applied to the conductor, a discharge is generated with respect to a portion of a different potential in the vacuum chamber, and the emission of an ion beam from the ion source becomes unstable.

According to the invention of claim 4, the current density distribution in the width direction of the ion beam emitted from the ion source which is located at a predetermined angle with respect to the substrate can be measured by the beam measuring instrument. Therefore, a further effect that a result of the measurement can be used in characteristic evaluation of the ion beam, adjustment of the ion source, and the like is attained.

According to the invention of claim 5, the beam measuring instrument is disposed at a position opposed to the ion source which is located at an angle that is substantially perpendicular to the substrate. Therefore, the beam measuring instrument can be located in the vicinity of the ion source, and it is easy to cause the ion beam to enter substantially perpendicularly the beam measuring instrument. Consequently, a further effect that the accuracy of measurement by the beam measuring instrument can be enhanced.

According to the invention of claim 6, the angle of the ion source can be easily adjusted to a desired value from the outside of the vacuum chamber. As required such as for each substrate or for each lot of substrates, for example, the ion source is moved to a measurement position, the current density distribution of the ion beam is measured and evaluated, and necessary adjustment is conducted, and thereafter the ion source can be moved to a process position to apply the process on the substrate. As a result, the stable process can be conducted easily.

BRIEF DESCRIPTION OF THE DRAWINGS

FIG. 1 is a longitudinal section view showing an embodiment of the ion beam irradiation apparatus of the invention.

FIG. 2 is a longitudinal section view showing the apparatus of FIG. 1 as viewing from the right direction.

FIG. 3 is a longitudinal section view showing a further specific example of a beam measuring instrument in FIGS. 1 and 2.

FIG. 4(a) is a side view simplifiedly showing an example of the state of incidence of an ion beam to the surface of a substrate in the case where the center axis of a rotation shaft for rotating an ion source is remote from the substrate surface.

FIG. 4(b) is a side view simplifiedly showing an example of the state of incidence of the ion beam to the surface of the substrate in the case where the center axis of the rotation shaft for rotating the ion source is near the substrate surface.

FIG. 5 is a side view showing relationships between the width on the side of an outlet of the ion source and the position of the center axis of the rotation shaft for rotating the ion source.

FIG. 6 is a side view showing an example in which the center axis of the ion source is deviated from that of an arm.

FIG. 7 is a side view showing an example in which the rotation center of the ion source is located in the ion source.

FIG. 8 is a plan view showing an example of relationships between the substrate and the ion beam irradiated to the surface thereof.

Figure 1:
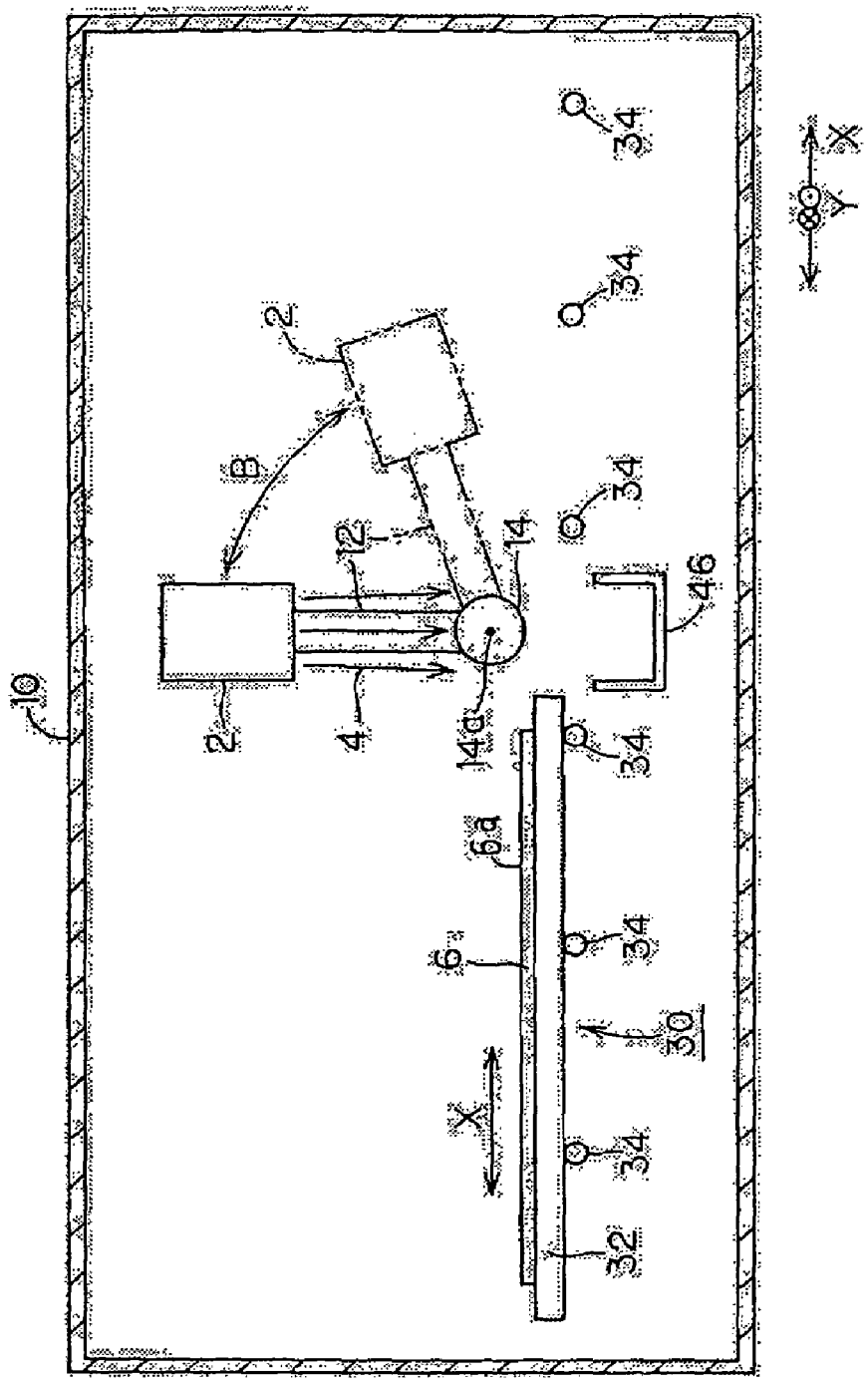
[FIG. 1]

DESCRIPTION OF REFERENCE NUMERALS AND SIGNS 2 ion source
4 ion beam
6 substrate
10 vacuum chamber
12 arm
14 rotation shaft
14a center axis
22 motor
30 substrate driving mechanism
46 beam measuring instrument

BEST MODE FOR CARRYING OUT THE INVENTION

Figure 2:
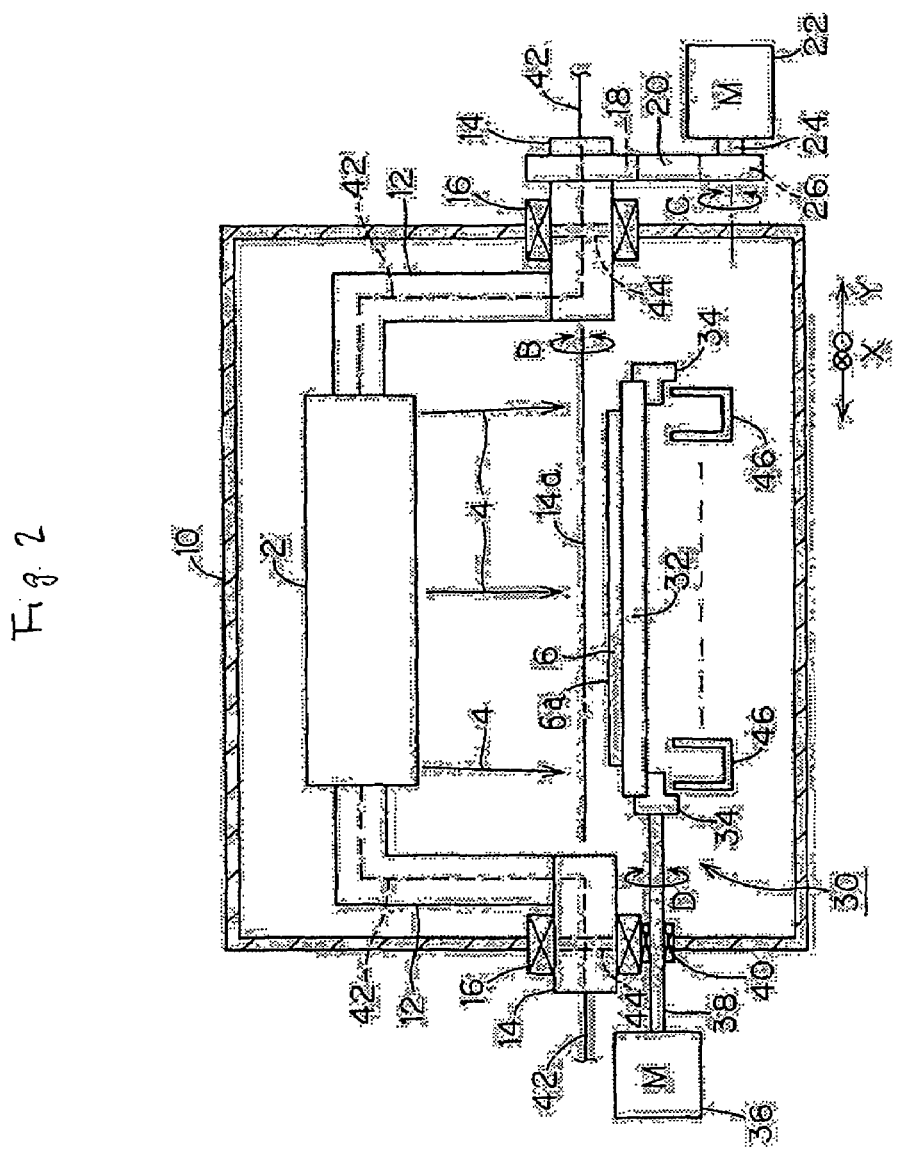
[FIG. 2]
Figure 7:
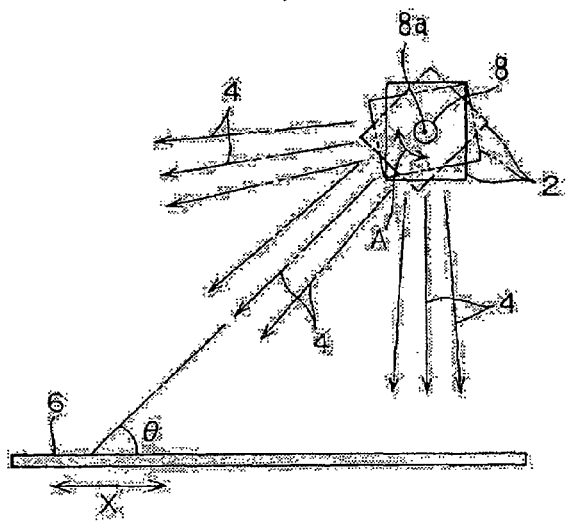
[FIG. 7]
Figure 7:
Figure 8:
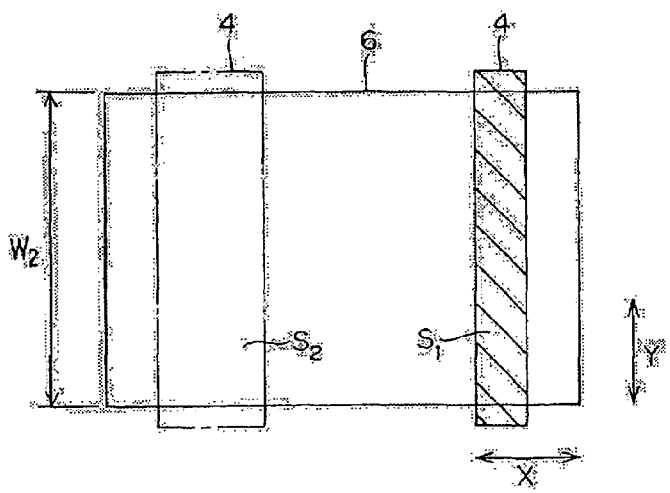
[FIG. 8]

FIG. 1 is a longitudinal section view showing an embodiment of the ion beam irradiation apparatus of the invention. FIG. 2 is a longitudinal section view showing the apparatus of FIG. 1 as viewing from the right direction. The portions which are identical with or equivalent to those of the example shown in FIGS. 7 and 8 are denoted by the same reference numerals, and hereinafter differences with respect to the example will be mainly described.

The ion beam irradiation apparatus comprises a vacuum chamber 10 which is to be evacuated to a vacuum, and an ion source 2 which is disposed inside the vacuum chamber.

The ion source 2 emits an ion beam 4 which is wider than a substrate 6 to be processed, to the substrate 6. The shape of the substrate 6 is not restricted to a specific one. In the case where the plan shape of the substrate 6 is a rectangle which is long in the X-direction and short in the Y-direction as shown in FIG. 8, the ion source 2 emits the ion beam 4 which is wider than the width $W_2$ of the short side (i.e., in the Y-direction). In this example, therefore, the ion source 2 has a shape which is elongated in the Y-direction, and which is similar to a rectangular parallelpiped. For example, the ion source 2 emits the ion beam 4 having a rectangular section shape which is short in the X-direction and long in the Y-direction such as shown in FIG. 8. In the description, the width of the ion beam 4 means the width in the Y-direction.

For example, the substrate 6 is a flat substrate for a liquid crystal display. In this case, an alignment film may be previously formed on the surface of the substrate 6 before an alignment process by the ion beam 4, or an alignment film may be formed on the surface of the substrate 6 by irradiation of the ion beam 4 and an alignment process may be applied on the alignment film.

The ion beam irradiation apparatus further comprises a substrate driving mechanism 30 which linearly drives the substrate 6 in the vacuum chamber 10 in the X-direction that is substantially perpendicular to the width direction (i.e., Y-direction) of the ion beam 4 emitted from the ion source 2. The driving of the substrate 6 by the substrate driving mechanism 30 may be performed in one direction. However, reciprocal driving is preferable because of reasons such as that the irradiation amount of the ion beam 4 to the substrate 6 is increased. In the embodiment, reciprocal driving is performed. The driving speed of the substrate 6 when the ion beam 4 is incident on the substrate 6 is kept constant.

In this example, the substrate driving mechanism 30 comprises: a plate-like substrate support member 32 which supports the substrate 6; a plurality of rollers 34 which are arranged in two rows; and a motor 36. The plural rollers 34 which are arranged in two rows support both end portions in the Y-direction of the substrate support member 32. The motor 36 is disposed outside the vacuum chamber 10, and reciprocally rotates a predetermined one of the rollers 34 via a rotation shaft 38 as indicated by the arrow D (see FIG. 2). The roller 34 coupled with the rotation shaft 38, and the other rollers 34 are connected to one another by, for example, chains or belts, so as to be rotated in an interlocking manner. A bearing 40 having a vacuum sealing function is disposed in a portion where the rotation shaft 38 penetrates passed through the vacuum chamber 10. When the motor 36 reciprocally rotates, the substrate support member 32 and the substrate 6 thereon can be moved on the rollers 34 reciprocally and linearly in the X-direction within the irradiation region of the ion beam 4 from the ion source 2.

However, the substrate driving mechanism 30 is not restricted to the configuration of the example. For example, the substrate support member 32 may not be used, and the substrate 6 may be directly supported by the rollers 34 so as to be slid on the rollers 34 to perform reciprocal movement. Alternatively, a tray-like member may be used as the substrate support member 32. In place of the rollers 34, the motor 36, and the like, a linear driving apparatus (for example, an air cylinder) for moving reciprocally and linearly the plate-like or tray-like substrate support member 32 may be disposed.

The ion beam irradiation apparatus further comprises rotation shafts 14, arms 12, and a motor 22. The rotation shafts 14 penetrate through the vacuum chamber 10, and the center axes 14a of the shafts are located in a place separated from the ion source 2 toward the substrate 6, and substantially parallel to the surface 6a of the substrate 6 and also to the Y-direction. The arms 12 are disposed inside the vacuum chamber 10, and support the ion source 2 through the rotation shafts 14 (in other words, the arms connect the rotation shafts 14 with the ion source 2 in the vacuum chamber 10). The motor 22 is disposed outside the vacuum chamber 10, and reciprocally rotates the rotation shafts 14 as indicated by the arrow B. According to the configuration, the ion source 2 is supported inside the vacuum chamber 10 so as to be rotatable about the center axes 14a of the rotation shafts 14 as indicated by the arrow B.

In this example, the rotation shafts 14 and the arms 12 are disposed on the both sides in the Y-direction of the ion source 2. According to the configuration, it is possible to stably support the ion source 2 from the both sides. However, the invention is not restricted to this configuration. For example, the rotation shaft 14 and the arm 12 may be disposed only on one side of the ion source 2. In portions where the rotation shafts 14 penetrate through the vacuum chamber 10, bearings 16 having a vacuum sealing function are disposed respectively.

In the example, the arms 12 have an L-like shape. The arms 12 support the ion source 2 in substantially parallel to the center axes 14a of the rotation shafts 14 with directing the outlet (an emission port for the ion beam 4) toward the substrate 6.

The motor 22 can reciprocally rotate as shown by the arrow C (see FIG. 2). This example is configured so that the rotation force is transmitted to one of the rotation shafts 14 through: a pulley 26 attached to a rotation shaft 24 of the motor 22; a pulley 18 attached to the rotation shaft 14; and a belt 20 which is looped around the pulleys 18, 26. However, the mechanism for transmitting the rotation force of the motor 22 may have a configuration other than this example. For example, the mechanism may use a timing belt, gears, etc. Alternatively, a motor 22 of a low rotational speed may be used and the motor may be directly coupled to the rotation shaft 14.

The rotation shafts 14 and the arms 12 may be solid, or, as in the embodiment, may be hollow. This will be described later.

According to the ion beam irradiation apparatus, by rotating the rotation shaft 14 by the motor 22, the ion source 2 is rotated from the outside of the vacuum chamber 10 without opening the vacuum chamber 10, and about the center axis 14a of the rotation shaft 14. Therefore, the incident angle θ (see FIGS. 4, 5, and 7) of the ion beam 4 to the substrate 6 can be easily changed.

Furthermore, the center axis 14a of the rotation shaft 14 is located at a place separated from the ion source 2 toward the substrate 6, and the ion source 2 is rotated about the center axis 14a. Even in the case where the incident angle θ is small, therefore, deviation of the irradiation position of the ion beam 4 to the substrate 6, and spreading of the irradiation region of the ion beam 4 to the substrate 6 can be suppressed to a small degree as compared with the case where the center axis 8a is located inside the ion source 2 as in the example shown in FIG. 7. As a result, miniaturization of the apparatus is enabled, and lowering of the throughput of the apparatus can be suppressed.

Figure 4A:
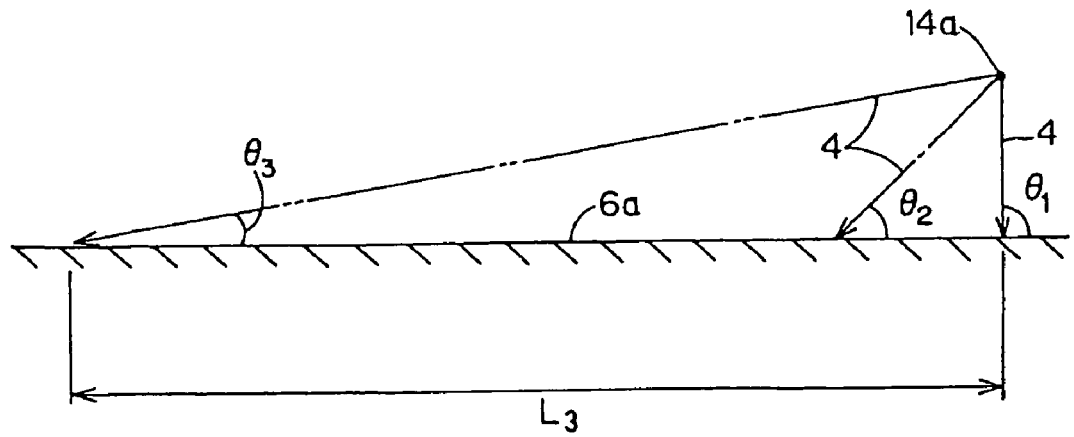
[FIG. 4(a)]
Figure 4B:
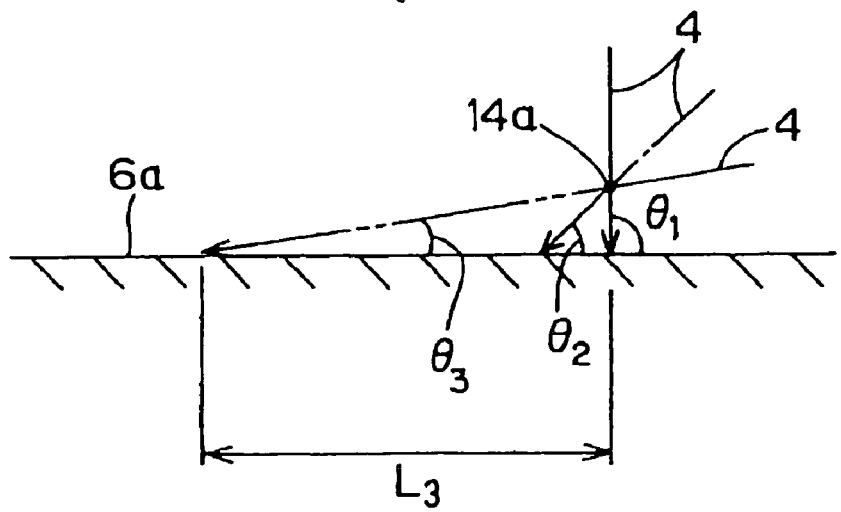
[FIG. 4(b)]

This will be further described. The position and size of the irradiation region of the ion beam 4 to the substrate 6 when the incident angle θ is smaller than 90 degrees largely differ depending on the position of the rotation center of the ion source 2, i.e., the center axis 14a of the rotation shaft 14. FIG. 4A shows an example in which the center axis 14a is located near the outlet of the ion source 2, and FIG. 4B shows an example in which the center axis 14a is located near the substrate surface 6a.

In both the examples, as the incident angle θ of the ion beam 4 is made smaller from $\theta_1$ (=90 degrees) to $\theta_2$ or $\theta_3$, the irradiation position of the ion beam 4 to the substrate surface 6a is more deviated from the position of the incident angle $\theta_1$ (the distance is $L_3$). In the case where the incident angles $\theta_2$ and $\theta_3$ of the same value are to be realized, however, the deviation distance $L_3$ in the example of FIG. 4B can be made very smaller than that in the example of FIG. 4A. Therefore, the ion beam irradiation apparatus can be correspondingly miniaturized.

Since the ion beam 4 emitted from the ion source has a tendency to diverge because of the space charge effect or the like, the irradiation region of the ion beam 4 to the substrate surface 6a is wider as the distance $L_3$ is longer. In the example of FIG. 4B, therefore, spreading of the irradiation region can be more suppressed to a small degree. As a result, the driving distance (scan width) in the X-direction of the substrate 6 which is required for irradiating the whole face of the substrate 6 with the ion beam 4 can be prevented from being largely increased. Therefore, the apparatus can be miniaturized also in this point of view. Furthermore, the substrate process time is prevented from being prolonged, so that lowering of the throughput of the apparatus can be suppressed.

Figure 5:
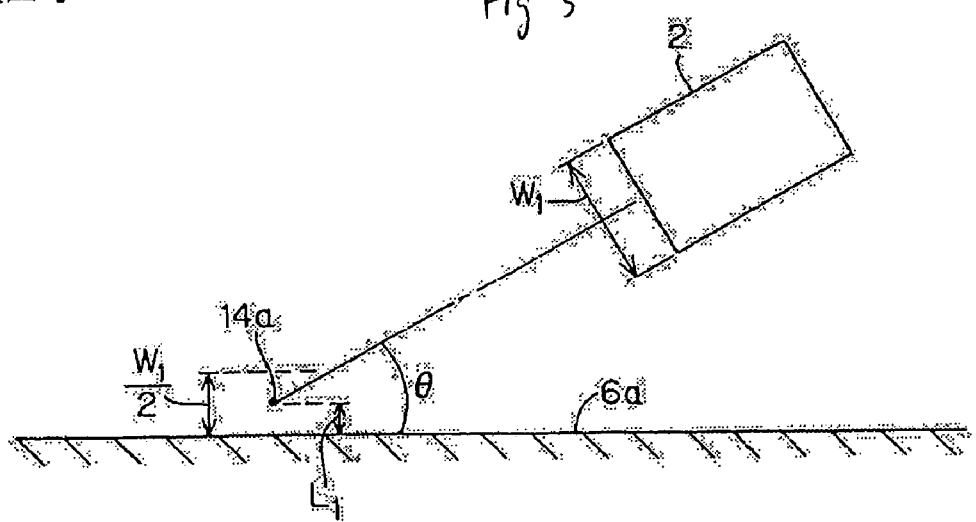
[FIG. 5]

As described above, it is preferable to locate the center axes 14a of the rotation shafts 14 near the substrate surface 6a. Referring to FIG. 5, when the center axes 14a are located near the substrate surface 6a, however, there is a possibility that, when the incident angle θ is very small, a lower portion of the ion source 2 butts against the substrate surface 6a. In order to prevent this from occurring, there arises a need to prolong the arms 12 to increase the distance between the ion source 2 and the center axes 14a.

In order to enable a small incident angle θ to be realized in a practical distance between the ion source 2 and the center axes 14a, preferably, the distance $L_1$ between the center axes 14a of the rotation shafts 14 and the substrate surface 6a is set within a range of 0 or more and about $W_1/2$ or less, in view of the size of the ion source 2 (specifically, the width $W_1$ of the ion source 2 on the side of the rotation direction, or the width on the side of the outlet of the ion source 2).

In the case where the center axes 14a of the rotation shafts 14, i.e., the rotation center of the ion source 2 is located within the range, and at a place near the substrate surface 6a, even when the incident angle θ is small, deviation of the irradiation position of the ion beam to the substrate 6, and spreading of the irradiation region of the ion beam to the substrate 6 can be suppressed to a smaller degree. As a result, further miniaturization of the apparatus is enabled, and lowering of the throughput of the apparatus can be further suppressed.

Figure 6:
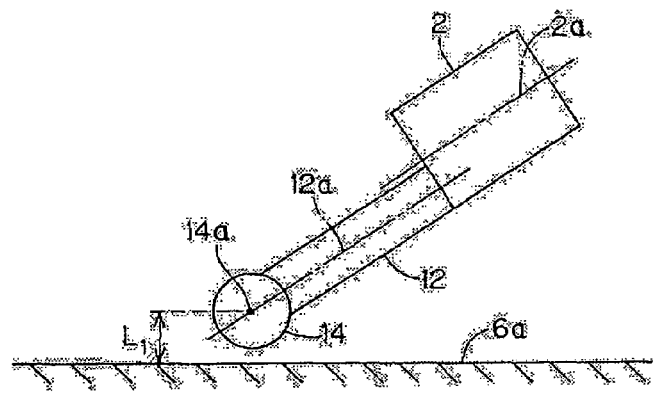
[FIG. 6]

In the example of FIG. 1, the center axes 12a of the arms 12 coincide with the center axis 2a of the ion source 2 (with respect to both the axes, see FIG. 6). However, the invention is not restricted to this configuration. As an example shown in FIG. 6, the center axis 2a of the ion source 2 may be coupled with being shifted from the center axes 12a of the arms 12 toward the side opposite to the substrate 6. According to the configuration, when a small incident angle is employed, a lower portion of the ion source 2 hardly butts against the substrate surface 6a. Even when an ion source of the same width $W_1$ is used, therefore, the distance $L_1$ can be further shortened, or the distance between the ion source 2 and the center axes 14a can be further reduced. As a result, in any case, further miniaturization of the apparatus is enabled because of the above mentioned reason.

As described above, the rotation shafts 14 and the arms 12 may be hollow. In the embodiment, this configuration is employed. Specifically, the rotation shafts 14 are cylindrical, the arms 12 have a duct-like shape, and the interiors of the members 14, 12 communicate with one another. The ends of the arms 12 on the side of the ion source 2 are connected to the ion source 2. A vacuum sealing member 44 which performs vacuum seal is disposed in the interiors of the rotation shafts 14 (for example, the interiors in the vicinity of the vacuum chamber 10). Furthermore, the rotation shafts 14 and the arms 12 are configured by a magnetic material such as iron, or carbon steel. Furthermore, the rotation shafts 14 and the arms 12 are electrically grounded. Also the vacuum chamber 10 is electrically grounded.

Conductors 42 through which an electric power is supplied from the outside of the vacuum chamber 10 to the ion source 2 are passed through in the rotation shafts 14 and the arms 12 to be guided to the ion source 2. In order to simplify the illustration, in FIG. 2, only one conductor 42 is illustrated in each of the right and left sides. However, the conductors are not restricted to one conductor in each side, and a necessary number of conductors can be passed. In the case where the rotation shaft 14 and the arm 12 are disposed on the both sides of the ion source 2, the conductors 42 may be passed through in the arms 12 and the like on one side, or through in the arm 12 and the like on the both sides. For example, the conductors 42 include: conductors for supplying a filament power for heating a filament of the ion source 2; conductors for supplying an arc power for arc discharge to the ion source 2; and conductors for supplying a high voltage to an ion beam emission electrode system of the ion source 2. In portions where these conductors 42 are passed through the vacuum chamber 10, current introducing terminals (not shown) having a vacuum sealing function are disposed respectively. These conductors 42 are insulatively supported by insulating spacers (not shown) which are disposed in adequate places in the rotation shafts 14 and the arms 12.

In the case where the ion source 2 is disposed inside the vacuum chamber 10, there arises a need to lay such a conductor through which the electric power is supplied to the ion source 2, near the ion source 2, because of, for example, restriction of the space inside the vacuum chamber 10 as compared with the case where the ion source is disposed outside the vacuum chamber 10. In such a case, particularly, there sometimes occurs a situation in which the ion beam 4 is adversely affected by a magnetic field generated by a current flowing through the conductor. For example, a situation in which the traveling direction of ions constituting the ion beam 4 is changed and the current density distribution of the ion beam 4 is disturbed sometimes arises. In the case where the ion source 2 is of the DC discharge type in which a hot filament is used for generating plasma, particularly, the filament current is large (for example, about 60 A), and hence a strong magnetic field due to the current is sometimes generated on the periphery.

By contrast, in the embodiment, the conductors 42 are passed through in the rotation shafts 14 and the arms 12 which have the magnetic shielding function. Therefore, leakage of a magnetic field generated by a current flowing through the conductors 42 can be suppressed to prevent the magnetic field from exerting adverse effects such as described above on the ion beam 4.

In order to avoid generation of impurities and gasses from a covering material, bare conductors are usually used as the conductors passed through in the vacuum chamber 10. In this case, when the conductors are laid in an exposed state inside the vacuum chamber 10, a phenomenon easily occurs in which, when a high voltage (for example, about several hundreds of voltage to several thousands of voltage) is applied to the conductors, a discharge is generated between the conductors and a neighboring portion of a different potential, and the emission of the ion beam 4 from the ion source 2 becomes unstable, because the circumference of the ion source 2 is a vacuum environment, and there are many ions and electrons which will function as a trigger for discharge.

By contrast, in the embodiment, the conductors 42 are passed through in the rotation shafts 14 and the arms 12 which are at the ground potential, and electrically shielded from the atmosphere in the vacuum chamber 10. Therefore, it is possible to suppress occurrence of the phenomenon in which, when a high voltage is applied to the conductors 42, a discharge is generated with respect to a portion of a different potential in the vacuum chamber 10, and the emission of the ion beam 4 from the ion source 2 becomes unstable.

In the embodiment, beam measuring instruments 46 which measure the current density distribution in the width direction of the ion beam 4 emitted from the ion source 2 are disposed at positions which are inside the vacuum chamber 10, and which are opposed to the ion source 2 across a passage for the substrate 6. The ion source 2 is located at a predetermined angle with respect to the substrate 6.

More specifically, in the embodiment, the beam measuring instruments 46 are disposed at positions opposed to the ion source 2 which is located at an angle that is substantially perpendicular to the substrate 6. However, the invention is not restricted to this.

The beam measuring instrument 46 for measuring the current density distribution in the width direction of the ion beam 4 may be plural (many) beam measuring instruments 46 which are juxtaposed in the width direction of the ion beam 4 as in the embodiment, or a single beam measuring instrument 46 which is mechanically scanned (driven) in the width direction of the ion beam 4. However, the former is preferable because the plural beam measuring instruments 46 can measure the current density distribution of the ion beam 4 at one time, and the measuring time can be shortened. In the case where the size of the substrate 6 is large and also the size of the ion source 2 is large, particularly, the former is preferable.

Figure 3:
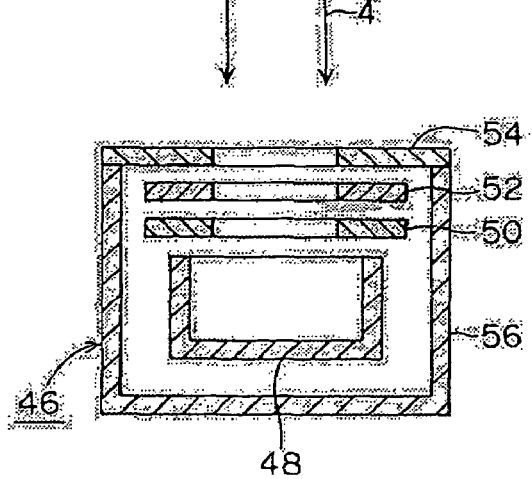
[FIG. 3]

A more specific example of the beam measuring instruments 46 is shown in FIG. 3. The beam measuring instrument 46 comprises: a Faraday cup 48; a negative suppressing electrode 50 which is disposed on the upstream side thereof; a positive suppressing electrode 52 which is disposed on the upstream side thereof; a grounding electrode 54 which is disposed on the upstream side thereof; and a conductor container 56. The Faraday cup 48 receives the ion beam 4 and measures the beam current density. The negative suppressing electrode 50 suppresses external leakage of secondary electrons which, when the ion beam 4 is incident on the Faraday cup 48, are released from the Faraday cup 48, and a negative voltage is applied to the electrode. The positive suppressing electrode 52 suppresses inflow of ions produced in the atmosphere of the upstream, into the Faraday cup 48, and a positive voltage is applied to the electrode. The grounding electrode 54 functions as a mask which defines the dimensions of the ion beam 4 entering the Faraday cup 48, electrically shields the electrodes and the like on the downstream side from the upstream side, and is electrically grounded. The conductor container 56 is connected to the grounding electrode 54, cooperates with the grounding electrode 54 to electrically shield the Faraday cup 48 and the electrodes 50, 52 which are inside the container, and is electrically grounded.

When the above-mentioned beam measuring instruments 46 are disposed, the current density distribution in the width direction of the ion beam 4 emitted from the ion source 2 which is located at a predetermined angle with respect to the substrate 6 can be measured by the beam measuring instruments 46. Therefore, a result of the measurement can be used in characteristic evaluation of the ion beam 4, adjustment of the ion source 2, and the like.

In addition to the measurement of the current density distribution of the ion beam 4, the use of the beam measuring instrument 46 at a necessary position can measure also the current density of the ion beam 4 at the position. From a measurement result of the current density distribution of the ion beam 4, it is possible also to obtain the uniformity of the current density distribution. The beam measuring instruments 46 are used also for such a measurement.

In this case, when, as in the embodiment, the beam measuring instruments 46 are disposed at positions opposed to the ion source 2 which is located at an angle that is substantially perpendicular to the substrate 6, the beam measuring instruments 46 can be located in the vicinity of the ion source 2, and it is easy to cause the ion beam 4 to enter substantially perpendicularly the beam measuring instruments 46. Therefore, the accuracy of measurement by the beam measuring instruments 46 can be enhanced.

Next, an example of a method of processing the substrate 6 with using the ion beam irradiation apparatus (the ion beam irradiation method) will be described.

(a) First Step

The rotation shaft 14 is rotated as required, and the ion source 2 is located at an angle at which the ion source is opposed to the beam measuring instruments 46. While the ion beam 4 is generated from the ion source 2 under conditions which are manually or previously set, the current density distribution of the ion beam 4 emitted from the ion source 2 is measured with using the beam measuring instruments 46. At this time, also the current density of the ion beam 4 at a necessary position, and the uniformity of the current density distribution of the ion beam 4 may be measured as required.

(b) Second Step

Next, it is determined whether the measured current density distribution is within a predetermined allowable range or not. If the distribution is within the allowable range, the process proceeds to a next step, and, if the distribution is not within the allowable range, adjustment of causing the current density distribution to be within the allowable range is performed manually or automatically. At this time, also the current density of the ion beam 4 at the necessary position, and the uniformity of the current density distribution of the ion beam 4 may be evaluated as required. If necessary, their adjustment may be conducted manually or automatically. Then, it is checked that necessary ion beam conditions are satisfied.

(c) Third Step

Next, the rotation shaft 14 is rotated, and the ion source 2 is located at a predetermined angle required for processing the substrate 6.

(d) Fourth Step

Next, while the substrate 6 is driven by the substrate driving mechanism 30 as described above, the substrate 6 is irradiated with the ion beam from the ion source 2, to apply a process on the substrate 6. For example, an alignment process such as described above is applied on the surface of the substrate 6 for a liquid crystal display.

According to the ion beam irradiation method, the angle of the ion source 2 can be easily adjusted to a desired value from the outside of the vacuum chamber 10. As required such as for each substrate or for each lot of substrates, for example, the ion source is moved to a measurement position, the current density distribution of the ion beam is measured and evaluated, and necessary adjustment is conducted, and thereafter the ion source can be moved to a process position to apply the process on the substrate. As a result, the stable process can be conducted easily.

In the case where the alignment process is to be applied to the substrate 6, the ion beam irradiation apparatus can be referred to as an ion beam alignment apparatus or an ion beam aligning process apparatus and the like, and the ion beam irradiation method can be referred to as an ion beam alignment method or an ion beam aligning process method and the like. While the invention has been described in detail and with reference to the specific embodiments, it is obvious to those skilled in the art to make various changes and modulations without departing from the spirit and scope of the invention.

The present application is based on Japanese Patent Application (No. 2004-255648) filed Sep. 2, 2004, and its disclosure is incorporated herein by reference.

The invention claimed is:

1. An ion beam irradiation apparatus comprising:
a vacuum chamber which is to be evacuated to a vacuum;
an ion source which is disposed inside said vacuum chamber, and which irradiates a substrate to be processed with an ion beam that is larger in width than the substrate;
a substrate driving mechanism which drives the substrate in said vacuum chamber in a direction that is substantially perpendicular to a width direction of the ion beam emitted from said ion source;
a rotation shaft which is passed through said vacuum chamber, and a center axis of which is located in a place separated from said ion source toward the substrate, and substantially parallel to a surface of the substrate;
an arm which is disposed inside said vacuum chamber, and which supports said ion source through said rotation shaft; and
a motor which is disposed outside said vacuum chamber, and which reciprocally rotates said rotation shaft,
said ion source being supported to be rotatable about said center axis of said rotation shaft.

2. An ion beam irradiation apparatus according to claim 1, wherein a distance between said center axis of said rotation shaft and the surface of the substrate is equal to or less about a half of a width of said ion source on a side of a rotation direction, or a width on a side of an outlet of said ion source.

3. An ion beam irradiation apparatus according to claim 1, wherein said rotation shaft and said arm are configured by a hollow magnetic member to have a magnetic shielding function, and set to a ground potential, and a conductor through which an electric power is supplied from an outside of said vacuum chamber to said ion source is passed through in said rotation shaft and said arm.

4. An ion beam irradiation apparatus according to claim 1, 2, or 3, wherein a beam measuring instrument which measures a current density distribution in the width direction of the ion beam emitted from said ion source is disposed at a position which is inside said vacuum chamber, and which is opposed to said ion source across a passage for the substrate, said ion source being located at a predetermined angle with respect to the substrate.

5. An ion beam irradiation apparatus according to claim 4, wherein said beam measuring instrument is disposed at a position opposed to said ion source which is located at an angle that is substantially perpendicular to the substrate.

* * * * *